US008458568B2

(12) United States Patent
Cideciyan et al.

(10) Patent No.: US 8,458,568 B2
(45) Date of Patent: Jun. 4, 2013

(54) SYSTEMS AND METHODS FOR MEMORY DEVICES

(75) Inventors: Roy D. Cideciyan, Rueschlikon (CH); Xiao-Yu Hu, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 12/889,692

(22) Filed: Sep. 24, 2010

(65) Prior Publication Data

US 2012/0079351 A1 Mar. 29, 2012

(51) Int. Cl.
| | |
|---|---|
| H03M 13/00 | (2006.01) |
| G11C 29/00 | (2006.01) |
| H04L 1/00 | (2006.01) |
| H03M 13/35 | (2006.01) |
| G06F 11/10 | (2006.01) |

(52) U.S. Cl.
CPC ............ *H04L 1/0009* (2013.01); *H04L 1/0057* (2013.01); *H03M 13/35* (2013.01); *G06F 11/1068* (2013.01)
USPC .......................................... 714/774; 714/773

(58) Field of Classification Search
CPC ..... H04L 1/0009; H04L 1/0057; H03M 13/35; G06F 11/1068
USPC .................................................. 714/774, 773
See application file for complete search history.

(56) References Cited

U.S. PATENT DOCUMENTS

| | | | | | |
|---|---|---|---|---|---|
| 5,459,850 | A | * | 10/1995 | Clay et al. ..................... | 711/171 |
| 5,465,338 | A | * | 11/1995 | Clay .............................. | 710/316 |
| 5,617,552 | A | * | 4/1997 | Garber et al. .................... | 711/1 |
| 5,699,539 | A | * | 12/1997 | Garber et al. .................... | 711/2 |
| 5,996,029 | A | * | 11/1999 | Sugiyama et al. .............. | 710/15 |
| 6,145,069 | A | * | 11/2000 | Dye .............................. | 711/170 |
| 6,177,934 | B1 | * | 1/2001 | Sugiura et al. ................ | 715/748 |
| 7,106,911 | B2 | * | 9/2006 | Ohta et al. ..................... | 382/251 |
| 7,190,284 | B1 | * | 3/2007 | Dye et al. ......................... | 341/51 |
| 7,454,070 | B2 | * | 11/2008 | Ito et al. ......................... | 382/232 |
| 7,653,847 | B1 | * | 1/2010 | Liikanen et al. .............. | 714/723 |
| 7,680,345 | B2 | * | 3/2010 | Ito et al. ......................... | 382/232 |
| 7,685,360 | B1 | * | 3/2010 | Brunnett et al. .............. | 711/112 |
| 7,752,491 | B1 | * | 7/2010 | Liikanen et al. ............. | 714/6.13 |
| 2008/0126686 | A1 | * | 5/2008 | Sokolov et al. ............... | 711/103 |
| 2011/0320915 | A1 | * | 12/2011 | Khan ............................. | 714/773 |

OTHER PUBLICATIONS

S. Hong et al., "NAND Flash-based Disk Cache Using SLC/MLC Combined Flash Memory," 2010 IEEE, 2010 International Workshop on Storage Network Architecture and Parallel I/Os, May 3, 2010.
S. Lee et al., "FlexFS: A Flexible Flash File System for MLC NAND Flash Memory," USENIX Annual Technical Conference (USENIX '09), San Diego, USA, Jun. 14-19, 2009.
S. Rigler et al., "FPGA-Based Lossless Data Compression Using Huffman and LZ77 Algorithms," Copyright 2007 IEEE, downloaded on Jun. 21, 2010 from IEEE Xplore, pp. 1235-1238.

* cited by examiner

*Primary Examiner* — Joseph D Torres
(74) *Attorney, Agent, or Firm* — Cantor Colburn LLP; Daniel Morris

(57) ABSTRACT

A method for writing data to a memory array includes receiving a write request including data from a processor, compressing the data, assigning a page strength to the compressed data, the page strength defined by a compression ratio used to compress the data, generating a parity data block associated with the compressed data, and saving the compressed data and the parity data block in a page of the memory array, the page of the memory array having a page strength corresponding to the assigned page strength of the compressed data.

17 Claims, 7 Drawing Sheets

| Compression Ratio (c) | Page Strength (s) | ECC Parity per code word ($P_s$) [bit] | ECC capability per code word ($E_s$) [symbol] |
|---|---|---|---|
| $c < c_1$ | 1 | $P_1$ | $E_1$ |
| $c_1 \leq c < c_2$ | 2 | $P_2, P_2 > P_1$ | $E_2, E_2 > E_1$ |
| $c_2 \leq c < c_3$ | 3 | $P_3, P_3 > P_2$ | $E_3, E_3 > E_2$ |
| ... | ... | ... | ... |
| $c_{N-1} \leq c$ | N | $P_N, P_N > P_{N-1}$ | $E_N, E_N > E_{N-1}$ |

| Errors Corrected (e) | Page Strength (s) |
|---|---|
| $T_0 < e \leq T_1$ | 1 |
| $T_1 < e \leq T_2$ | 2 |
| . . . | . . . |
| $T_{N-1} < e \leq T_N$ | N |

FIG. 7

SYSTEMS AND METHODS FOR MEMORY DEVICES

BACKGROUND

The present invention relates to memory devices, and more specifically, to writing methods for memory devices. Solid state or flash memory devices may include single level cell (SLC) regions and multi-level cell (MLC) regions. The memory devices may be arranged in blocks with a plurality of pages included in each block.

In a typical write operation, a write request is received and a processor determines which region will receive the data. A write buffer stores the data until there is at least a full page size of data that may then be transferred to the pages of the memory device.

Though the pages of a particular memory device are typically the same size, individual pages may not have the same robustness to errors due to a variety of factors. For example, pages may become less reliable over time, since some memory devices degrade due to multiple reading and writing operations. In SLC flash memories, pages may be erased and written approximately 100,000 times. In MLC flash memories, pages may be erased and written approximately 10,000 times or less. Thus, flash memories typically have low endurance. The reliability of pages may be also influenced by, for example, temperature and humidity.

Pages are often partitioned into two regions: a data region that stores user data; and an overhead region that stores metadata and parity bits for correcting data errors using an error-correction coding (ECC) scheme.

BRIEF SUMMARY

According to one embodiment of the present invention, a method for writing data to a memory array includes receiving a write request including data from a processor, compressing the data, assigning a page strength to the compressed data, the page strength defined by a compression ratio used to compress the data, generating a parity data block associated with the compressed data, and saving the compressed data and the parity data block in a page of the memory array, the page of the memory array having a page strength corresponding to the assigned page strength of the compressed data.

According to another embodiment of the present invention, a system for writing data to a memory array includes a memory array, and a processor operative to receive a write request including data, compress the data, assign a page strength to the compressed data, the page strength defined by a compression ratio used to compress the data, generate a parity data block associated with the compressed data, and save the compressed data and the parity data block in a page of the memory array, the page of the memory array having a page strength corresponding to the assigned page strength of the compressed data.

According to yet another embodiment of the present invention, a computer readable medium includes instructions for receiving a write request including data from a processor, compressing the data, assigning a page strength to the compressed data, the page strength defined by a compression ratio used to compress the data, generating a parity data block associated with the compressed data, and saving the compressed data and the parity data block in a page of a memory array, the page of the memory array having a page strength corresponding to the assigned page strength of the compressed data.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 illustrates a table for assigning page strength to data during the process of writing a page.

FIG. 7 illustrates a table for assigning page strength to a page during the process of reading the page.

DETAILED DESCRIPTION

As discussed above, different pages in a memory array may each have different levels of reliability due to for example, degradation of memory cells over time, manufacturing processes, or external factors such as, for example, temperature and humidity. One exemplary method for determining the reliability of pages in a memory array includes reading data from a page and determining a number of data errors corrected by an ECC scheme. Pages may then be sorted based on a number of errors found in each page. The sorted pages may be defined as "stronger" and "weaker" pages based on the relative reliability of the pages. For example, a stronger page is relatively more reliable (less prone to data errors) than a weaker page (that is more prone to errors).

Pages in a memory array include a user data region and an overhead region. The user data region stores the user data, and the overhead region stores ECC parity bits (redundancy data) and metadata associated with the user data. Both weak and strong pages typically have uniform overhead regions that are the same size (and user data regions that are the same size). Since weaker pages are more prone to errors, it is desirable to use a more robust ECC scheme to store data on weaker pages than the ECC scheme used to store data on stronger pages. The more robust ECC scheme uses more parity bits than a less robust ECC scheme. Thus, the parity bits stored in a weaker page consume more space in a weaker page than the space consumed by parity bits stored in a stronger page.

Compression of the user data in a page allows compressed data to be stored in a smaller user data region of a page, thereby increasing the available size of the overhead region that stores ECC parity data. For a weaker page, compressing the user data allows the increased size of the overhead region to be used to store more parity bits for a more robust ECC scheme. Computations have shown that a relatively very small amount of data compression (e.g. 1%-5% corresponding to a compression ratio of 1.01-1.05) allows a very significant increase in ECC protection leading to the maximum tolerable raw bit error rate at the input of the ECC decoder being about one order higher than the maximum tolerable raw bit error rate in the absence of compression. Thus, a relatively small amount of compression allows the use of weak pages. The methods and systems described below include an exemplary method for identifying and sorting strong and weak pages, and methods for writing data to strong and weak pages.

Figure 1:
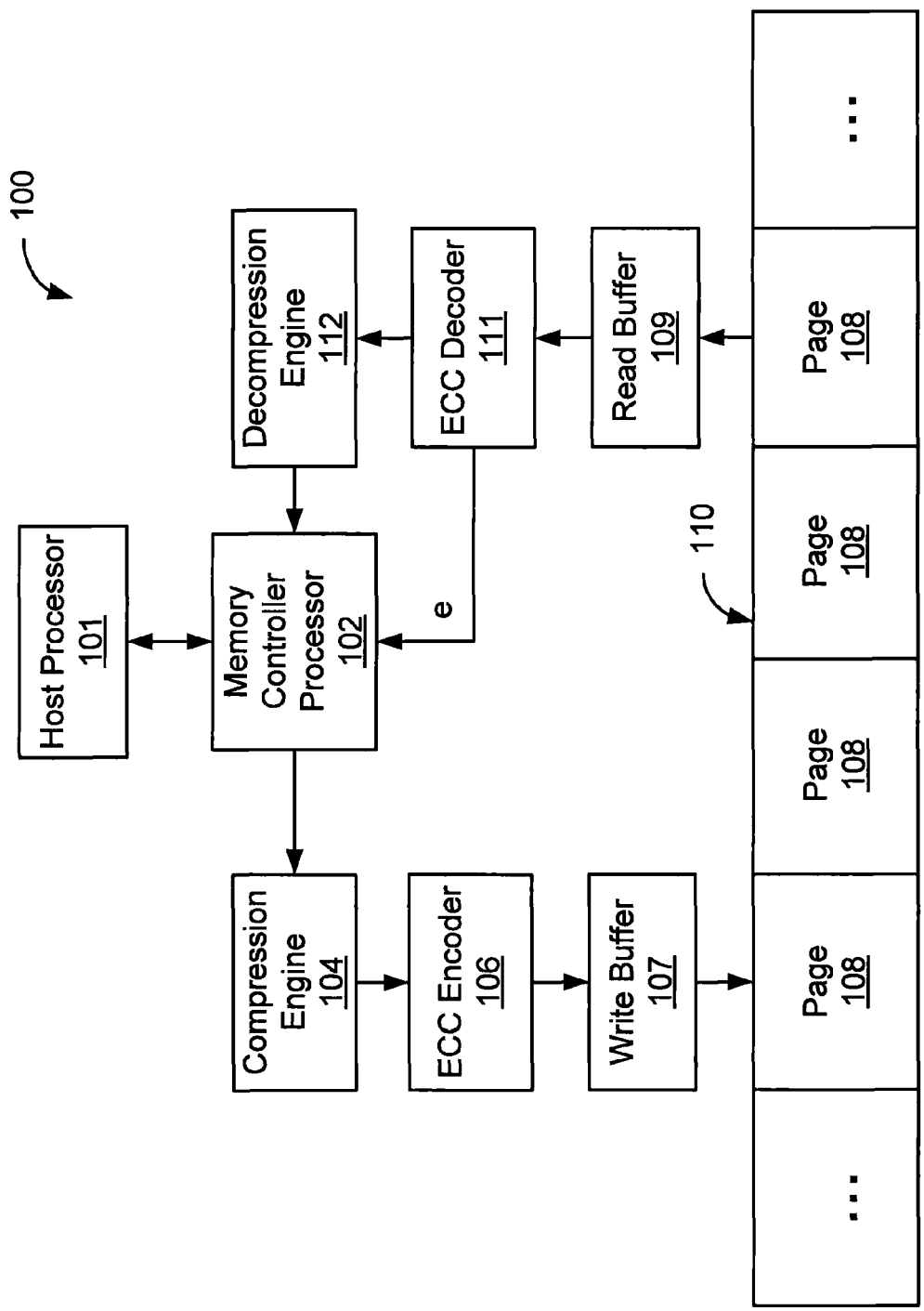
FIG. 1 illustrates a block diagram of an exemplary embodiment of a system.

FIG. 1 illustrates a block diagram of an exemplary embodiment of a system 100 that includes a host processor 101 communicatively connected to a memory controller processor 102. The memory control processor 102 is communicatively connected to a compression engine 104, an error-correction code (ECC) encoder 106, and a write buffer 107. The write buffer 107 is communicatively connected to a memory array 110 that includes a plurality of pages 108. The pages 108 may be accessed in a random access manner. The memory control processor 102 is communicatively connected to a decompression engine 112, an ECC decoder 111, and a read buffer 109 that is communicatively connected to the memory array 110.

Figure 2:
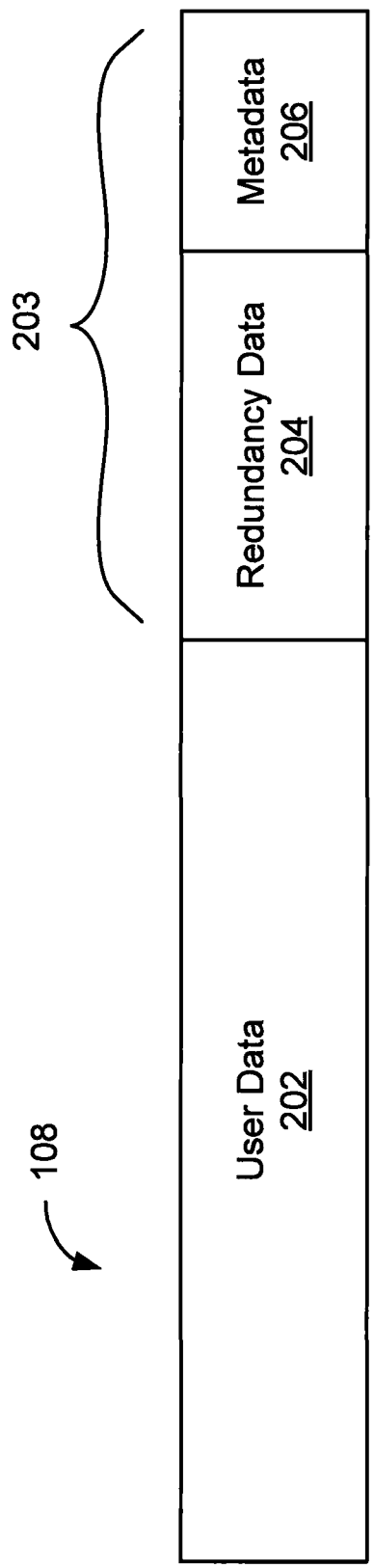
FIG. 2 illustrates a block diagram of an exemplary embodiment of a page.

FIG. 2 illustrates a block diagram of an exemplary embodiment of a page 108. The page 108 includes a user data region 202 and an overhead data region 203. The overhead data region 203 includes a redundancy data region 204 and a metadata region 206. The user data region 202 is used to store user data. The redundancy data region 204 stores redundancy data from error-correction code processes that may be performed on the stored user data. The metadata region 206 stores metadata associated with the user data.

Figure 3:
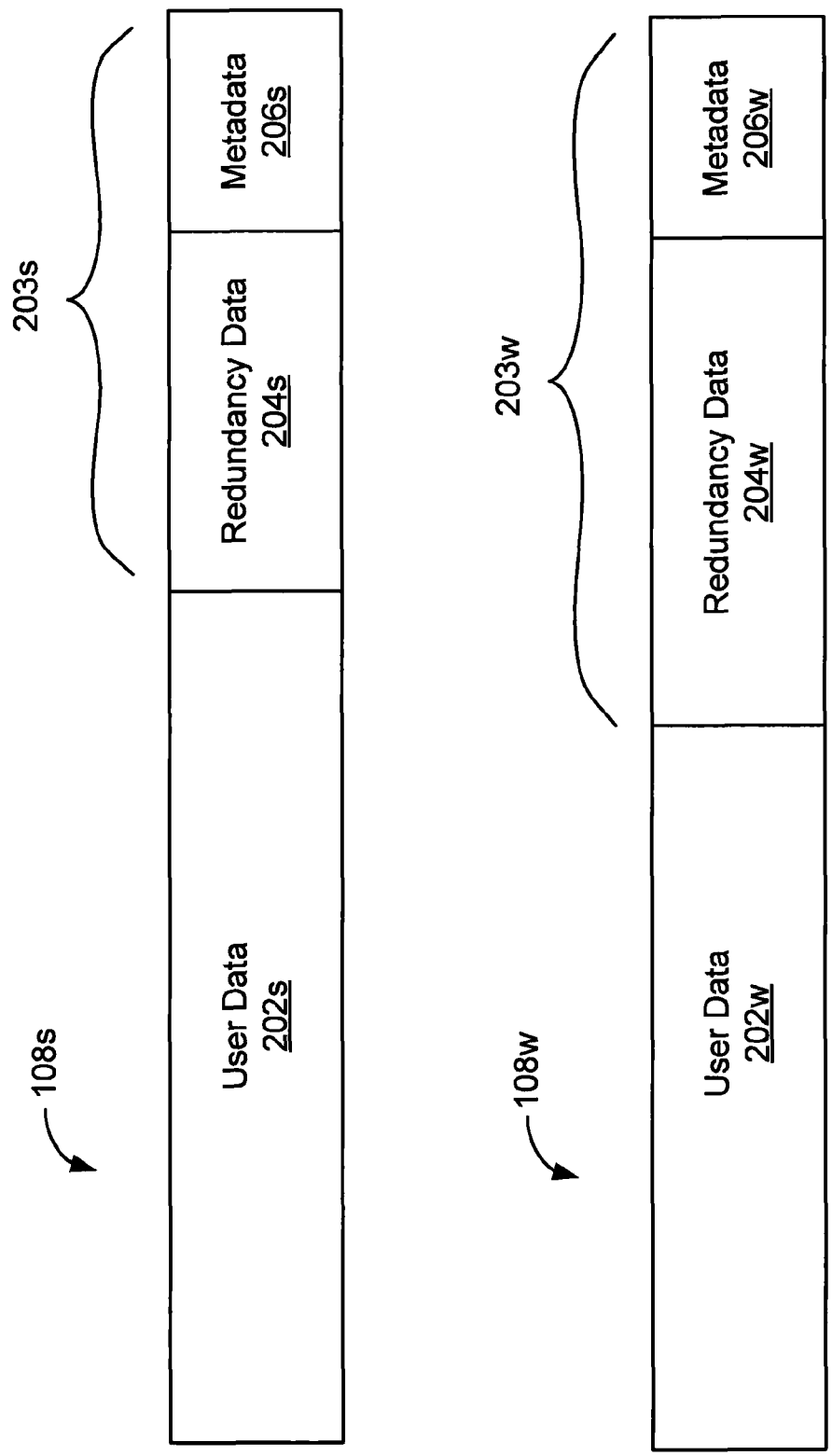
FIG. 3 illustrates a block diagram of an example of weak and strong pages.

FIG. 3 illustrates a block diagram of an example of resultant weak and strong pages following a data storage method that will be described in further detail below. In this regard, in the illustrated exemplary embodiment, a memory array includes a strong page 108s and a weak page 108w. The weak page 108w has lower reliability than the strong page 108s, and thus, it is desirable to store data in the weak page using a more robust error-correction code (ECC) scheme than the ECC used in the strong page 108s. In the illustrated example of FIG. 3, each page 108 has 4224 total bytes of data and overhead. (The example below includes mere examples of page sizes and arrangements; alternate embodiments may include any number of page sizes having any variety of region sizes and arrangements.) The user data region 202s of the strong page 108s includes 4096 bytes. The overhead region 203s includes total 128 bytes divided into the redundancy data region 204s having 120 bytes and the metadata region 206s having 8 bytes. The weak page 108w includes a user data region 202w having 4014 bytes. The overhead region 203w includes 210 bytes where the redundancy data region 204w has 202 bytes and the metadata region 206w has 8 bytes. In operation, since the strong page 108s is more reliable than the weak page 108w, data may be stored in the user data region 202s of the strong page 108s using the 120 bytes of the redundancy data region 204s for ECC redundancy data. The lesser reliability of the weak page 108w may be compensated for by compressing the user data using a lossless compression scheme to fit into the 4014 byte user data region 202w. An ECC scheme that is more robust than the ECC used in the strong page 108s is applied to the user data stored in the user data region 202w. The ECC used for the data in the weak page 108w results in ECC redundancy data of 202 bytes that is stored in the redundancy data region 204w.

The resultant arrangement allows for various ECC schemes, such as, for example, Bose-Chaudhuri, Hocquenghem (BCH), Reed-Solomon (RS), and low-density parity-check (LDPC) to be applied to pages as determined by the strength of the pages. Alternatively, one code family such as BCH, RS or LDPC may be selected and different codes within that family having differing ratios of data region size and redundancy region size may be used as determined by the strength of the pages. Thus, for example, a stronger page 108 that is more reliable may use a larger user data region 202 for data storage of user data and a smaller redundancy data region 204 for ECC redundancy data. The stronger page 108 may store the user data in an uncompressed format, or may, in some instances, compress the user data for storage in the user data region 202s. A relatively weaker page 108 may include a smaller user data region 202 and a larger redundancy data region 204; allowing for the use of a more robust ECC scheme that results in a larger amount of ECC redundancy data. The user data is compressed using a lossless data compression scheme to fit the user data into the relatively smaller user data region 202 using a compression ratio associated with the weaker page.

FIG. 4 illustrates an example of a table 400 that associates page strengths values (s) with compression ratios (c), corresponding ECC parity bits per code word ($P_s$) and ECC capability per code word ($E_s$) during writing operations. The ECC capability is given in symbol where a symbol corresponds to a fixed pre-specified number of bits. The ECC capability indicates the maximum number of symbol errors in a code word a particular error correcting code can correct. Some codes correct bit errors in which case a symbol would correspond to one bit. Other codes, for example RS codes, correct symbol errors where the symbol size in bits is determined by the particular code selected.

Figure 5:
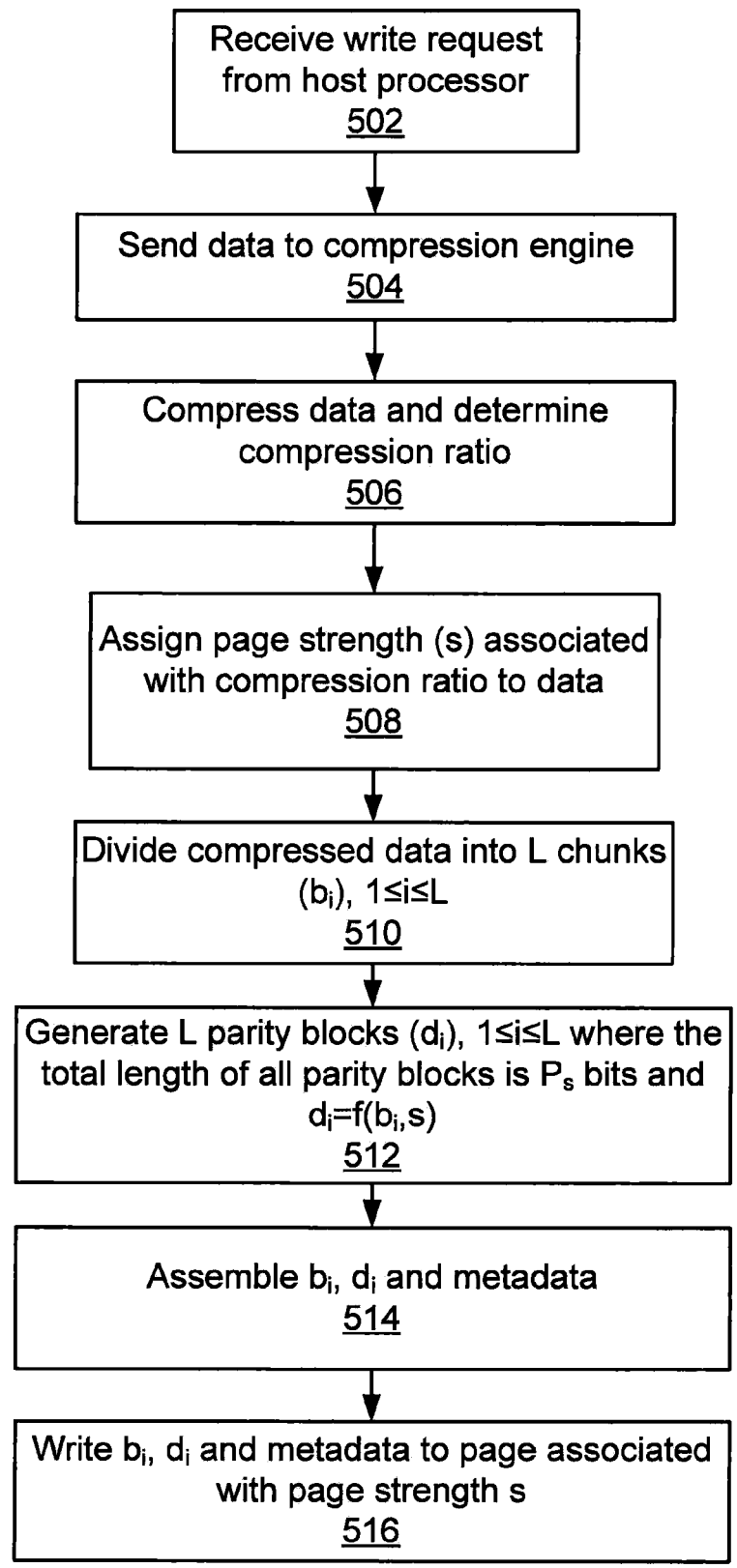
FIG. 5 illustrates a block diagram of an exemplary method for storing data in a memory array.

FIG. 5 illustrates an exemplary embodiment of a block diagram for an exemplary method for writing data to the memory array 110 (of FIG. 1). In this regard, in block 502, a write request is received from a host processor. The write request includes user data to be written to the memory array 110. The user data is sent to the compression engine 104 in block 504. In block 506, the user data is compressed and a compression ratio (c) is determined for the compression of the user data. In block 508, a page strength (s) is assigned to the compressed user data. The page strength may be assigned using, for example the table of FIG. 4. The compressed data is divided into L chunks ($b_i$), $1 \leq i \leq L$ in block 510. In block 512, L number of parity blocks ($d_i$), $1 \leq i \leq L$ are generated, where the total length of all parity blocks is $P_s$ bits and $d_i = f(b_i, s)$ where f is the encoding function corresponding to the page strength s. The chunks, parity blocks, and associated metadata are assembled in block 514. In block 516, the chunks, parity blocks, and associated metadata are written to a page 108 having a page strength greater than or equal to the assigned page strength s of the compressed user data.

Figure 6:
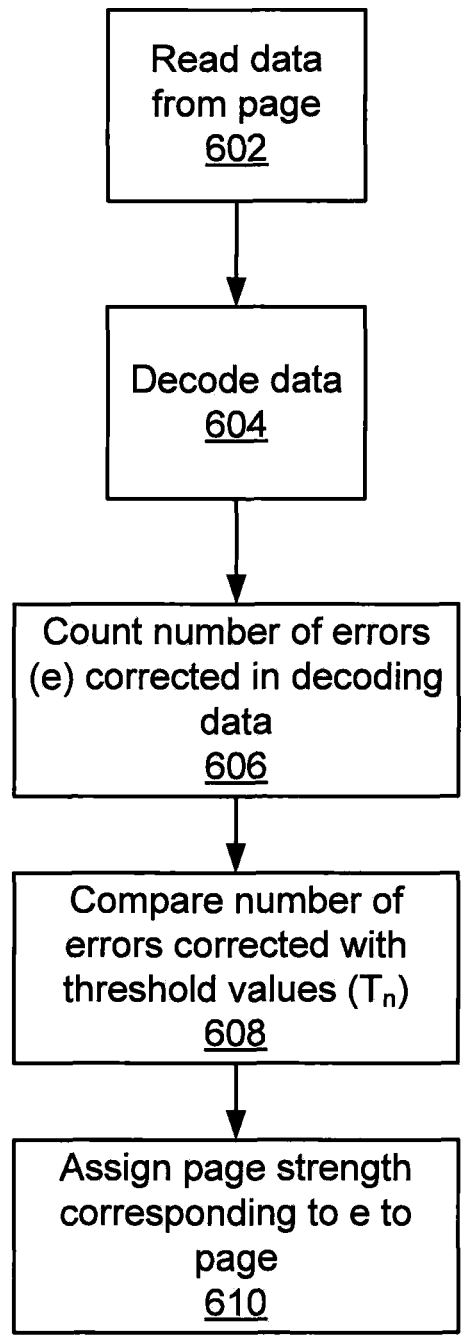
FIG. 6 illustrates a block diagram of an exemplary method for determining page strength.

FIG. 6 illustrates a block diagram of an exemplary method for assigning a page strength value to a page 108 in the memory array 110 (of FIG. 1) in a reading operation. In this regard, in block 602, data is read from a page 108. The data is decoded in block 604. In block 606 a number of errors (e) are determined. The number of errors includes the number of errors that are corrected by the ECC decoder 111. The number of errors that are corrected is compared with one or more threshold values ($T_n$) in block 608. In block 610 a page strength is associated with the page 108 corresponding to the comparison of the number of errors and the threshold values. The page strength may be saved in, for example, metadata in the page 108 or memory that may be accessed by the memory controller processor 102. FIG. 7 illustrates an example of a table 700 that includes the number of errors, threshold values, and associated page strengths. The lowest threshold $T_0$ may often equal to −1 indicating that the case of no errors (e=0) corresponds to the strongest page with strength s=1. If $T_N \leq e$, the read page is considered to be too weak to be ever used again to store a page.

The technical effects and benefits of the illustrated embodiments include identifying stronger and weaker pages in a memory array and writing data to weaker pages by using a compression and ECC scheme assigned to a weaker page. Thereby increasing the reliability of weaker pages in the memory array.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for writing data to a memory array, the method including:
   receiving a write request including data from a processor;
   compressing the data;
   assigning a page strength to the compressed data, the page strength defined by a compression ratio used to compress the data;
   generating a parity data block associated with the compressed data;
   saving the compressed data and the parity data block in a page of the memory array, the page of the memory array having a page strength corresponding to the assigned page strength of the compressed data;
   reading the compressed data and the parity block associated with the compressed data from the page;
   correcting possible errors in compressed data by decoding the read page;
   calculating the number of errors that are corrected;
   determining whether the number of errors that are corrected exceeds the first threshold value without exceeding the second threshold value; and
   associating a page strength with the page, the associated page strength corresponding to the number of errors that are corrected being within a range of values defined by the first and the second threshold values.

2. The method of claim 1, wherein the method further includes dividing the compressed data into chunks of data responsive to assigning the page strength to the compressed data.

3. The method of claim 2, wherein the generating a parity data block associated with the compressed data includes generating a parity data block for each chunk of data.

4. The method of claim 1, wherein the method further includes saving metadata associated with the compressed data in the page of the memory array.

5. The method of claim 1, wherein the memory array is divided into a plurality of pages.

6. The method of claim 1, wherein each page of the plurality of pages includes at least one compressed data region and at least one parity data region.

7. A system for writing data to a memory array, the system including:
   a memory array; and
   a processor operative to receive a write request including data, compress the data, assign a page strength to the compressed data, the page strength defined by a compression ratio used to compress the data, generate a parity data block associated with the compressed data, and save the compressed data and the parity data block in a page of the memory array, the page of the memory array having a page strength corresponding to the assigned page strength of the compressed data, to read the compressed data and the parity block associated with the compressed data from the page, correct possible errors in compressed data by decoding the read page, calculate the number of errors that are corrected, determine whether the number of errors that are corrected exceeds the first threshold value without exceeding the second threshold value, and associate a page strength with the page, the associated page strength corresponding to the number of errors that are corrected being within a range of values defined by the first and the second threshold values.

8. The system of claim 7, wherein the processor is further operative to divide the compressed data into chunks of data responsive to assigning the page strength to the compressed data.

9. The system of claim 8, wherein the generating a parity data block associated with the compressed data includes generating a parity data block for each chunk of data.

10. The system of claim 7, wherein the processor is further operative to save metadata associated with the compressed data in the page of the memory array.

11. The system of claim 7, wherein the memory array is divided into a plurality of pages.

12. The system of claim 7, wherein each page of the plurality of pages includes at least one compressed data region and at least one parity data region.

13. A non-transitory computer readable medium including instructions for:
   receiving a write request including data from a processor;
   compressing the data;
   assigning a page strength to the compressed data, the page strength defined by a compression ratio used to compress the data;
   generating a parity data block associated with the compressed data;
   saving the compressed data and the parity data block in a page of a memory array, the page of the memory array having a page strength corresponding to the assigned page strength of the compressed data;
   reading the compressed data and the parity block associated with the compressed data from the page;
   correcting possible errors in compressed data by decoding the read page;
   calculating the number of errors that are corrected;
   determining whether the number of errors that are corrected exceeds the first threshold value without exceeding the second threshold value; and
   associating a page strength with the page, the associated page strength corresponding to the number of errors that are corrected being within a range of values defined by the first and the second threshold values.

14. The computer readable medium of claim 13, wherein the computer readable medium further includes instructions for dividing the compressed data into chunks of data responsive to assigning the page strength to the compressed data.

15. The computer readable medium of claim 14, wherein the generating a parity data block associated with the compressed data includes generating a parity data block for each chunk of data.

16. The computer readable medium of claim 13, wherein the computer readable medium further includes instructions for saving metadata associated with the compressed data in the page of the memory array.

17. The computer readable medium of claim 13, wherein the memory array is divided into a plurality of pages.

* * * * *